United States Patent
Chen

(10) Patent No.: US 7,865,852 B2
(45) Date of Patent: Jan. 4, 2011

(54) METHOD FOR AUTOMATICALLY ROUTING MULTI-VOLTAGE MULTI-PITCH METAL LINES

(75) Inventor: Ker-Min Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 310 days.

(21) Appl. No.: 11/779,233

(22) Filed: Jul. 17, 2007

(65) Prior Publication Data

US 2009/0024976 A1 Jan. 22, 2009

(51) Int. Cl.
*G06F 17/50* (2006.01)
(52) U.S. Cl. .................. 716/5; 716/4; 716/12; 716/13
(58) Field of Classification Search ............. 716/12–14, 716/19–21, 5, 4
See application file for complete search history.

(56) References Cited

U.S. PATENT DOCUMENTS

| | | | |
|---|---|---|---|
| 2003/0018949 A1* | 1/2003 | Yoshida | 716/14 |
| 2003/0163798 A1* | 8/2003 | Hwang et al. | 716/16 |
| 2006/0123367 A1* | 6/2006 | Sakurabayashi | 716/5 |
| 2009/0113362 A1* | 4/2009 | Lerner | 716/5 |

\* cited by examiner

*Primary Examiner*—Paul Dinh
*Assistant Examiner*—Nha T Nguyen
(74) *Attorney, Agent, or Firm*—K&L Gates LLP

(57) ABSTRACT

A method for program routing a circuit with at least a first and second voltages in a single layer is disclosed, which comprises defining a first and second layer types corresponding to the first and second voltages, respectively, specifying at least one first attribute for the first layer type and at least one second attribute for the second layer type, specifying at least one first net with a first voltage and at least one second net with a second voltage, reading the voltage information associated with the first net and the second net by a computer program, routing at least one first polygon for the first net onto the first layer type with the first attribute by the computer program, and routing at least one second polygon for the second net onto the second layer type with the second attribute by the same computer program.

13 Claims, 2 Drawing Sheets

METHOD FOR AUTOMATICALLY ROUTING MULTI-VOLTAGE MULTI-PITCH METAL LINES

BACKGROUND

The present invention relates generally to the design of integrated circuits (ICs), and, more particularly, to methods for placing and routing metal lines in the ICs.

A modern ultra-large scale integration (ULSI) chip may contain millions of transistors that makes manual layout of such large chips too time consuming to be practical. With the large sizes of modern designs, this operation is usually performed by electronic design automation (EDA) tools. An EDA tool takes in circuit descriptions, places sub-blocks in the design areas and routes, i.e., interconnects the sub-blocks. Metal layers are typically used for such interconnections. Traditionally, each metal layer receives one routing pitch defined by a design rule's minimum width and space in a technology file. The EDA tool routes the metals lines according to the routing pitch. The minimum space is often limited by a score of factors, some are process related, and some are electrical. Leakage under a certain voltage between two adjacent metal lines is one of the electrical limitations. Especially when low-K dielectric material is used, the leakage becomes even more sensitive to the metal spacing.

In many chip designs, different voltages may be used in different parts of a chip. For example, a core area and a peripheral area in a memory chip may use different voltages. Sometimes these different voltages may be routed on the same metal layer.

FIG. 1 illustrates a conventional metal layer layout with one spacing rule but two voltages. Three adjacent metal lines 110, 120 and 130 are coupled to different voltage sources. Spaces between these metal lines are uniformly at S0 routed by traditional EDA tools. A potential difference between metal lines 110 and 120 is V0. A potential difference between metal lines 130 and 120 is V1. V1 is higher than V0. For instance, V0=1.0V, and V1=1.8V. In this case, the metal lines 110, 120 and 130 may be connected to a core area high voltage supply Vcc, a ground and a peripheral high voltage supply Vdd, respectively. While the space S0 is sufficient for V0, V1 it may cause excessive leakage between the metal lines 120 and 130.

As such, what is desired is an EDA method for routing metal lines with different spaces according to voltages the metal lines carry.

SUMMARY

In view of the foregoing, the present invention provides a method for program routing a circuit with at least a first and second voltage in a single layer. In one aspect of the present invention, the method comprises defining a first and second layer types corresponding to the first and second voltages, respectively, specifying at least one first attribute for the first layer type and at least one second attribute for the second layer type, specifying at least one first net with a first voltage and at least one second net with a second voltage, reading the voltage information associated with the first net and the second net by a computer program, routing at least one first polygon for the first net onto the first layer type with the first attribute by the computer program, and routing at least one second polygon for the second net onto the second layer type with the second attribute by the same computer program.

In another aspect of the present invention, the method further comprises defining the first layer type with the corresponding at least one first attribute in a design rule check (DRC) input deck, defining the second layer type corresponding with at least one second attribute in the same DRC input deck and verifying the at least one first polygon and the at least one second polygon according to the DRC input deck.

Yet, in another aspect of the present invention, the method further comprises merging the first layer type with the second layer type to form a single layer for being taped out for mask making.

The construction and method of operation of the invention, however, together with additional objects and advantages thereof will be best understood from the following description of specific embodiments when read in connection with the accompanying drawings.

Figure 1:
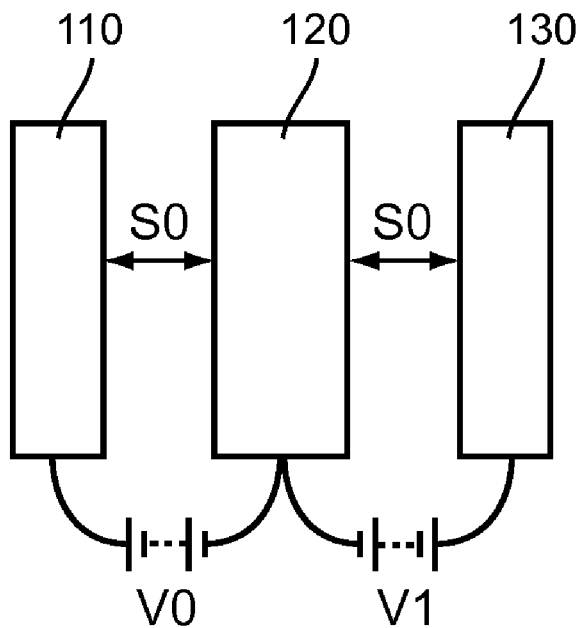
FIG. 1 illustrates a conventional metal layer layout with one spacing rule but two voltages.

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The following will provide a detailed description of a method for routing metal lines with different spaces when these metal lines are connected to different voltages.

Figure 2:
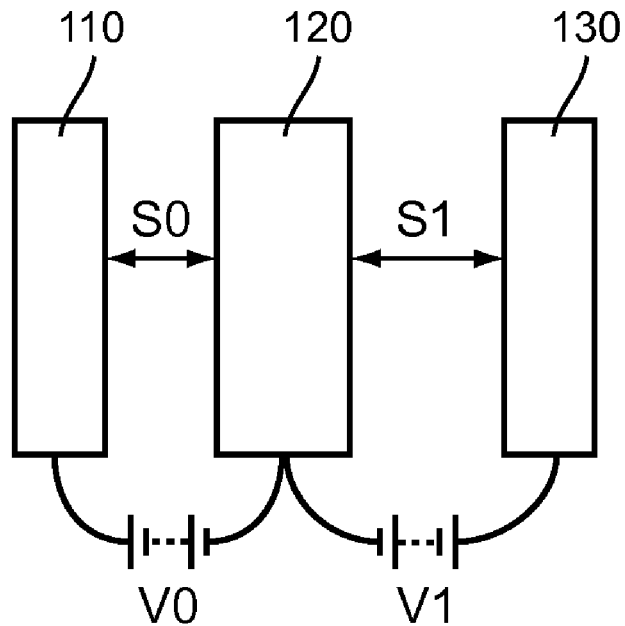
FIG. 2 illustrates a metal layer layout with different spacing rules for different voltages according to an embodiment of the present invention.

FIG. 2 illustrates a metal layer layout with different spacing rules for different voltages according to an embodiment of the present invention. As also shown in FIG. 1, the metal lines 110, 120 and 130 are on the same metal layer. The voltage difference between metal lines 110 and 120 is V0. The voltage between metal lines 130 and 120 is V1. V1 is higher than V0. In order to accommodate this higher voltage V1 and prevent a leakage between the metal lines 120 and 130, the space between the metal lines 120 and 130 is routed with a space S1, which is bigger than S0.

Figure 3:
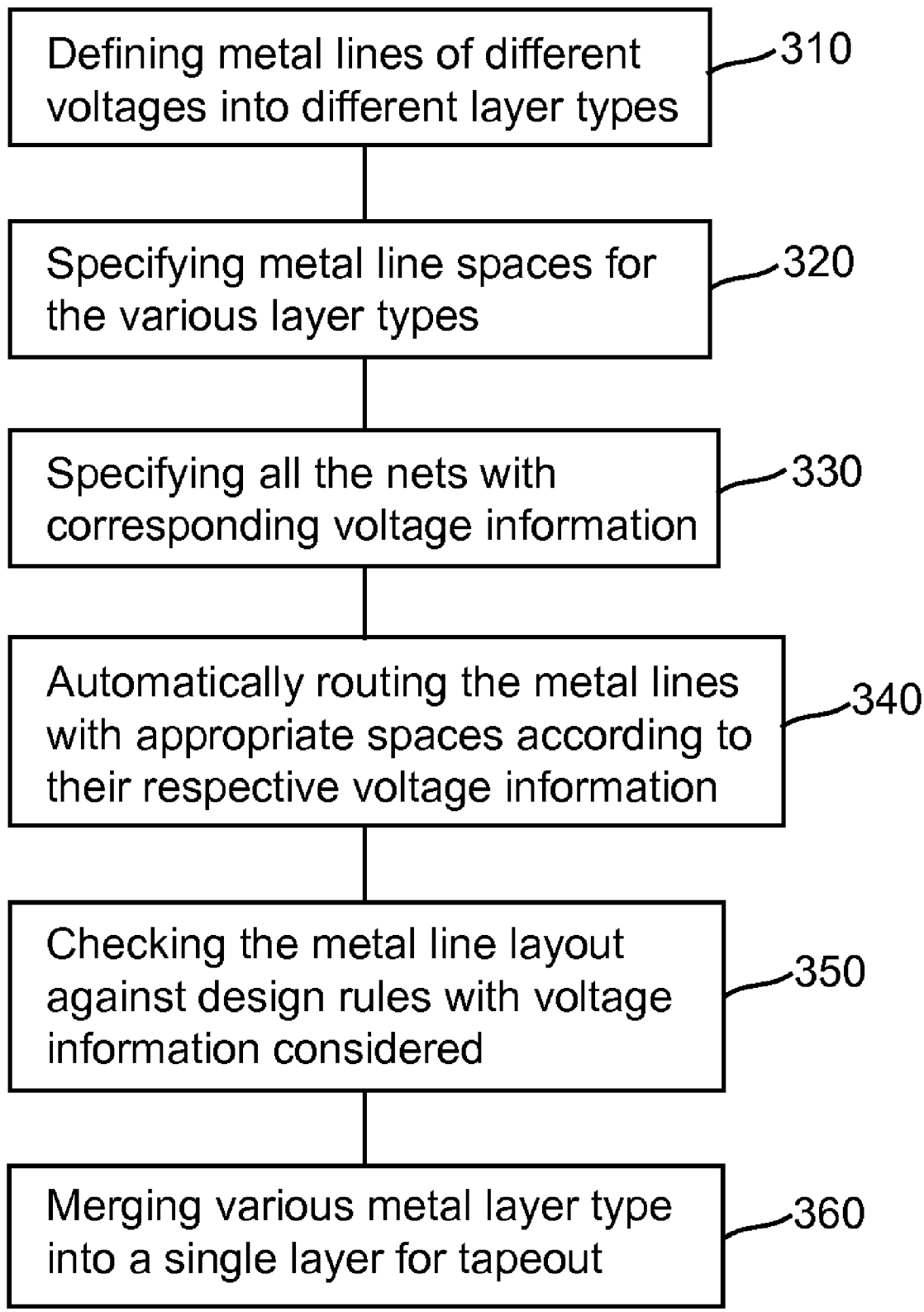
FIG. 3 is a flow chart illustrating a routing method for metal lines being coupled to different voltages according to the embodiment of the present invention.

FIG. 3 is a flow chart illustrating a routing method for metal lines being coupled to different voltages according to the embodiment of the present invention. The method begins with defining metal lines of different voltages into different layer types as shown in step 310. For example, type A of a GDSII layer 31 (31;A) represents a first metal1 routing with a core voltage (0.9V for instance), and type B of the same GDSII layer 31 (31;B) represents a second metal1 routing with an I/O voltage (1.8V for instance). The type definition may go on for every kind of voltages on a chip. For convenience purpose, the list of the layer types may follow a consistent trend of the voltages, i.e., type A's voltage is smaller than type B's voltage, which is then smaller than type C's voltage, etc.

Next, metal line spaces for the various layer types are specified by a user in step 320. For instance, for type A (0.9V) and type B (1.8V), minimum spaces equal to 1 um and 1.5 um, respectively, are specified. Then the user also specifies all the nets in a circuit description with corresponding voltage information in step 330.

During an automatically routing operation as shown in step 340, a routing program reads in the net information, including a voltage associated with the net. Every net is then assigned to a layer type according to its voltage information. Then metal lines are routed with spaces appropriate to their respective layer types. If two metal lines of different layer types are next to each other, the layer type with a higher voltage will prevail, i.e., the space between these two metal lines will take the higher voltage layer type's space. In effect, a single metal layer of different voltages may appear to be routed into several sub layers of unique voltages.

After the automatic routing operation is done, a design rule checking (DRC) is carried out in step 350 with an input deck containing the various space rules for different metal layer types. When the routing is positively checked and the chip design is ready for a tapeout, the various metal layer types, or sub layers, are then combined in step 360 into a single metal layer for a final mask making.

For library/IP implementation, cell layout must also follow the routing method described above. As in most cases, the cell layout is done manually. The routing method according to the present invention can certainly be carried manually for the library cells. More specifically, metal lines of different voltages may be defined into different layer types, which will then be merged back into a single layer when the layout is completed.

Although the metal line spacing is used to illustrate the embodiment of the present invention, a skilled artisan will realize that other attributes, such as metal lines with different width requirements, may also be routed using the same method as described above. Although a metal layer is used to illustrate the embodiment of the present invention, a skilled artisan would appreciate that the present invention may well be applied to other layers as well, as long polygon spacing on the layer is critical, and different polygons may be supplied with different voltages. The present invention may be implemented through a conventional EDA tool.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for program and routing a circuit with at least a first and second voltages in a single layer, the first voltage being higher than the second voltage, the method comprising:
defining a first and second layer types corresponding to the first and second voltages, respectively;
specifying at least one first attribute for the first layer type and at least one second attribute for the second layer type, wherein the at least one first attribute and the at least one second attribute are different space rules of polygons on the single layer;
specifying at least one first net in a description of the circuit with the first voltage and at least one second net of the same description of the circuit with the second voltage;
reading the voltage information associated with the at least one first net and the at least one second net by a computer program;
routing at least one first polygon for the at least one first net onto the first layer type with the at least one first attribute by the computer program;
routing at least one second polygon for the at least one second net onto the second layer type with the at least one second attribute by the same computer program, wherein the steps of routing are performed by using an electronic design automation (EDA) tools;
assigning the at least one first attribute to the at least one second polygon overriding the at least one second attribute when the at least one first polygon is adjacent to the at least one second polygon regardless of a width of the first and second polygons; and
combining the first layer type with the second layer type into the single layer for making a mask.

2. The method of claim 1, wherein the single layer is a metal layer.

3. The method of claim 1, wherein the at least one first attribute and the at least one second attribute are different width rules of polygons on the single layer.

4. The method of claim 1, wherein the description of the circuit is in a hardware description language.

5. The method of claim 1, wherein the computer program is an electronic design automation tool.

6. The method of claim 1, wherein the at least one first polygon and the at least one second polygon are straight lines.

7. The method of claim 1 further comprising:
defining the first layer type with the corresponding at least one first attribute in a design rule check (DRC) input deck;
defining the second layer type with the corresponding at least one second attribute in the same DRC input deck; and
verifying the at least one first polygon and the at least one second polygon according to the DRC input deck.

8. A method for program routing a circuit with at least a first and second voltages in a metal layer, the first voltage being higher than the second voltage, the method comprising:
defining a first and second layer types corresponding to the first and second voltages, respectively;
specifying at least one first attribute for the first layer type and at least one second attribute for the second layer type, wherein the at least one first attribute and the at least one second attribute are different space rules of polygons on the metal layer;
specifying at least one first net in a description of the circuit with the first voltage and at least one second net of the same description of the circuit with the second voltage;
reading the voltage information associated with the at least one first net and the at least one second net by a computer program;
routing at least one first polygon for the at least one first net onto the first layer type with the at least one first attribute by the computer program;
routing at least one second polygon for the at least one second net onto the second layer type with the at least one second attribute by the same computer program, wherein the steps of routing are performed by using an electronic design automation (EDA) tools;

assigning the at least one first attribute to the at least one second polygon overriding the at least one second attribute when the at least one first polygon is adjacent to the at least one second polygon regardless of a width of the first and second polygons;

defining the first layer type with the corresponding at least one first attribute in a design rule check (DRC) input deck;

defining the second layer type with the corresponding at least one second attribute in the same DRC input deck;

verifying the at least one first polygon and the at least one second polygon according to the DRC input deck; and combining the first layer type with the second layer type into a single metal layer for making a mask.

9. The method of claim 8, wherein the at least one first attribute and the at least one second attribute are different width rules of polygons on the single layer.

10. The method of claim 8, wherein the description of the circuit is in a hardware description language.

11. The method of claim 8, wherein the computer program is an electronic design automation tool.

12. A method for program routing a circuit with at least a first and second voltages in a metal layer, the first voltage being higher than the second voltage, the method comprising:

defining a first and second layer types corresponding to the first and second voltages, respectively;

specifying a first space attribute for the first layer type and a second space attribute for the second layer type, wherein the first space attribute and the second space attribute are different space rules of polygons on the metal layer;

specifying at least one first net in a description of the circuit with the first voltage and at least one second net of the same description of the circuit with the second voltage;

reading the voltage information associated with the at least one first net and the at least one second net by a computer program;

routing at least one first polygon for the at least one first net onto the first layer type with the first space attribute by the computer program;

routing at least one second polygon for the at least one second net onto the second layer type with the second space attribute by the same computer program except when the at least one second polygon being adjacent to the at least one first polygon, in which case, routing the at least one second polygon with the first space attribute instead, wherein the steps of routing are performed by using an electronic design automation (EDA) tools;

assigning the first space attribute to the at least one second polygon overriding the second space attribute when the at least one first polygon is adjacent to the at least one second polygon regardless of a width of the first and second polygons; and combining the first layer type with the second layer type into a single metal layer for making a mask.

13. The method of claim 12 further comprising:

defining the first layer type with the corresponding first space attribute in a design rule check (DRC) input deck;

defining the second layer type with the corresponding second space attribute in the same DRC input deck;

verifying the at least one first polygon and the at least one second polygon according to the DRC input deck.

* * * * *